(12) United States Patent
Zhao et al.

(10) Patent No.: US 7,838,863 B2
(45) Date of Patent: Nov. 23, 2010

(54) SEMICONDUCTOR DEVICES HAVING RESISTIVE MEMORY ELEMENTS

(75) Inventors: Jin-Shi Zhao, Gyeonggi-do (KR); Jang-Eun Lee, Gyeonggi-Do (KR); In-Gyu Baek, Seoul (KR); Hyun-Jun Sim, Gyeonggi-do (KR); Xiang-Shu Li, Gyeonggi-Do (KR); Eun-Kyung Yim, Seoul (KR)

(73) Assignee: Samsung Electronics Co. Ltd. (KR)

( * ) Notice: Subject to any disclaimer, the term of this patent is extended or adjusted under 35 U.S.C. 154(b) by 58 days.

(21) Appl. No.: 12/388,707

(22) Filed: Feb. 19, 2009

(65) Prior Publication Data

US 2009/0212273 A1    Aug. 27, 2009

(30) Foreign Application Priority Data

Feb. 21, 2008    (KR) .......................... 2008-0015848

(51) Int. Cl.
*H01L 29/02* (2006.01)
(52) U.S. Cl. .................. 257/4; 257/E29.068; 257/528
(58) Field of Classification Search .................. 257/4, 257/E29.068, 528, 536
See application file for complete search history.

(56) References Cited

U.S. PATENT DOCUMENTS

| | | | |
|---|---|---|---|
| 6,635,914 B2 | 10/2003 | Kozicki et al. | |
| 6,881,623 B2 * | 4/2005 | Campbell et al. | 438/257 |
| 6,998,312 B2 | 2/2006 | Kozicki et al. | |
| 7,101,728 B2 | 9/2006 | Kozicki et al. | |
| 7,718,533 B2 * | 5/2010 | Stanton | 438/689 |
| 2002/0168820 A1 | 11/2002 | Kozicki et al. | |
| 2002/0190350 A1 | 12/2002 | Kozicki et al. | |
| 2003/0168651 A1 | 9/2003 | Kozicki | |
| 2003/0209971 A1 | 11/2003 | Kozicki | |
| 2004/0238918 A1 * | 12/2004 | Moore et al. | 257/528 |
| 2007/0018219 A1 | 1/2007 | Lim et al. | |
| 2007/0058417 A1 | 3/2007 | Roehr | |
| 2007/0121369 A1 | 5/2007 | Happ | |

FOREIGN PATENT DOCUMENTS

KR    1020070005040 A    1/2007

* cited by examiner

*Primary Examiner*—Roy K Potter
(74) *Attorney, Agent, or Firm*—Myers Bigel Sibley & Sajovec

(57) ABSTRACT

Provided is a semiconductor device including a resistive memory element. The semiconductor device includes a substrate and the resistive memory element disposed on the substrate. The resistive memory element has resistance states of a plurality of levels according to generation and dissipation of at least one platinum bridge therein.

20 Claims, 6 Drawing Sheets

(a)

(b)

SEMICONDUCTOR DEVICES HAVING RESISTIVE MEMORY ELEMENTS

CROSS-REFERENCE TO RELATED APPLICATIONS

This U.S. non-provisional patent application claims priority under 35 U.S.C. §119 of Korean Patent Application No. 10-2008-0015848, filed on Feb. 21, 2008, the entire contents of which are hereby incorporated by reference.

BACKGROUND

The invention disclosed herein relates to semiconductor devices, and more particularly, to semiconductor devices including a resistive memory element.

Semiconductor devices may be classified into memory devices for storing data and logic devices for processing data. The memory devices may be classified into volatile memory devices and nonvolatile memory devices. A volatile memory device loses stored data when a power supply is stopped. For example, a dynamic random access memory (DRAM) device and a static random access memory (SRAM) device may be representative of volatile memory devices. A nonvolatile memory device may retain stored data even if the power supply is stopped. For example, a flash memory device may be representative of a nonvolatile memory device.

As a semiconductors become more highly developed, various characteristics with respect to the semiconductor device may become more desirable. For example, characteristics corresponding to multi-function, high-speed operation, high integration, stability against the external environment, low unit cost and/or low power consumption of the semiconductor device may become increasingly important. However, since such characteristics may be competing regarding one another, it may be difficult to satisfy the various characteristics of the semiconductor device. Thus, additional research for new semiconductor devices capable of satisfying the various characteristics may be beneficial.

SUMMARY

The present invention provides a semiconductor device including a resistive memory element having excellent reliability according to some embodiments described herein.

The present invention provides a semiconductor device including a resistive memory element that may have superior thermal stability according to some embodiments described herein.

In some embodiments, the present invention also provides a semiconductor device including a resistive memory element that may improve a sensing margin.

Some embodiments of the present invention also provide a semiconductor device including a resistive memory element that may have improved endurance.

Some embodiments of the present invention include a semiconductor device that includes a substrate and a resistive memory element disposed on the substrate. The resistive memory element may include multiple resistance state levels that correspond to generation and dissipation of at least one platinum bridge therein. Some embodiments include a first electrode that is on the substrate and connected to a first surface of the resistive memory element and a second electrode that is on the substrate and connected to a second surface of the resistive memory element.

In some embodiments, the first electrode and the second electrode are in contact with a first end and a second end of the platinum bridge, respectively. Some embodiments provide that the first electrode includes platinum. In some embodiments, the platinum bridge includes platinum particles that are injected from the first electrode into the resistive memory element.

Some embodiments provide that the platinum particles are injected from the first electrode into the resistive memory element responsive to application of a first initial voltage and a second initial voltage to the first electrode and the second electrode, respectively. In some embodiments, the first initial voltage is greater than the second initial voltage. Some embodiments provide that the platinum bridge is generated by respectively applying a first set voltage and a second set voltage to the first electrode and the second electrode and that an electric potential difference between the first set voltage and the second set voltage is less than an electric potential difference between the first initial voltage and the second initial voltage.

In some embodiments, a direction of an initial electric field generated by the first initial voltage and the second initial voltage is opposite to that of a set electric field generated by the first set voltage and the second set voltage. Some embodiments provide that the platinum bridge is dissipated by respectively applying a first reset voltage and a second reset voltage to the first electrode and the second electrode and that an electric potential difference between the first reset voltage and the second reset voltage is less than an electric potential difference between the first initial voltage and the second initial voltage.

In some embodiments, a direction of an initial electric field generated by the first initial voltage and the second initial voltage is equal to that of a reset electric field generated by the first reset voltage and the second reset voltage.

Some embodiments provide that the resistive memory element includes an insulating material doped with platinum atoms. In some embodiments, the platinum bridge including platinum atoms doped into the resistive memory element is generated by respectively applying a first set voltage and a second set voltage to the first electrode and the second electrode. Some embodiments provide that the platinum bridge is dissipated by respectively applying a first reset voltage and a second reset voltage to the first electrode and the second electrode. In some embodiments, a first initial voltage and a second initial voltage are applied to the first electrode and the second electrode, respectively, and an electric potential difference between the first initial voltage and the second initial voltage is equal to or greater than an electric potential difference between the first set voltage and the second set voltage.

In some embodiments, the first electrode includes platinum. Some embodiments provide that the generated platinum bridge includes platinum atoms doped into the resistive memory element and platinum within the first electrode.

In some embodiments, the platinum bridge is generated by applying a first set voltage and a second set voltage to the first electrode and the second electrode, respectively, and the platinum bridge is dissipated by applying a first reset voltage and a second reset voltage to the first electrode and the second electrode, respectively. Some embodiments provide that a direction of a set electric field generated by the first set voltage and the second set voltage is opposite to that of a reset electric field generated by the first reset voltage and the second reset voltage.

In some embodiments, the platinum bridge is generated by applying a first set voltage and a second set voltage to the first electrode and the second electrode, respectively, and an electric potential difference between the first set voltage and the second set voltage ranges from about 0.5V to about 1.5V.

Some embodiments provide that the resistive memory element includes an insulating material and the resistive memory element includes a first portion including a first density in the insulating material and a second portion having a second density that is different from the first density in the insulating material.

Some embodiments of the present invention include a semiconductor device that includes a substrate and a resistive memory element disposed on the substrate, the resistive memory element including multiple resistance state levels that correspond to generation and dissipation of at least one platinum bridge therein, a first electrode that is on the substrate and connected to a first surface of the resistive memory element, and a second electrode that is on the substrate and connected to a second surface of the resistive memory element.

In some embodiments, the platinum bridge includes platinum particles that are injected from the first electrode into the resistive memory element responsive to application of a first initial voltage and a second initial voltage to the first electrode and the second electrode, respectively. Some embodiments provide that the platinum bridge is generated by respectively applying a first set voltage and a second set voltage to the first electrode and the second electrode and an electric potential difference between the first set voltage and the second set voltage is less than an electric potential difference between the first initial voltage and the second initial voltage. In some embodiments, a direction of an initial electric field generated by the first initial voltage and the second initial voltage is opposite to that of a set electric field generated by the first set voltage and the second set voltage.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention.

DETAILED DESCRIPTION

Figure 1:
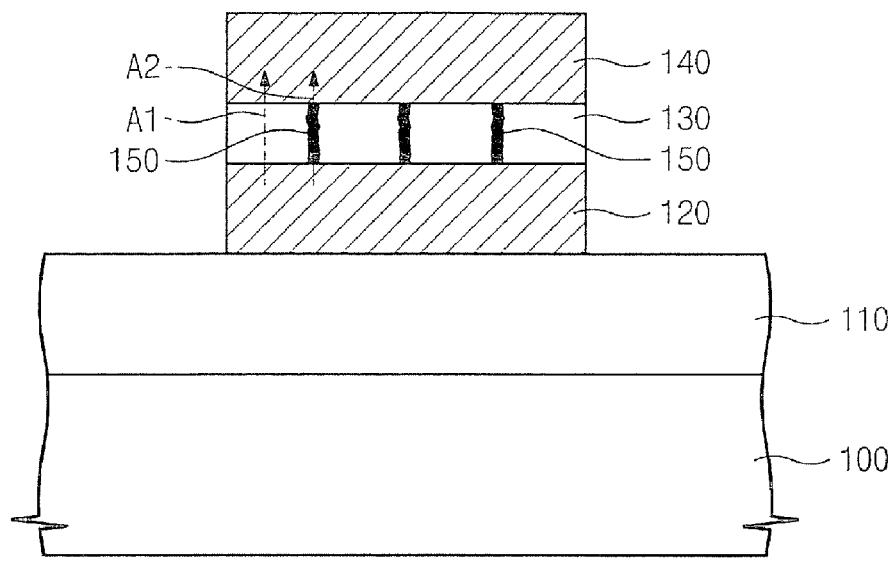
FIG. 1 is a cross-sectional view illustrating one state of a resistive memory element included in a semiconductor device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

Figure 2:
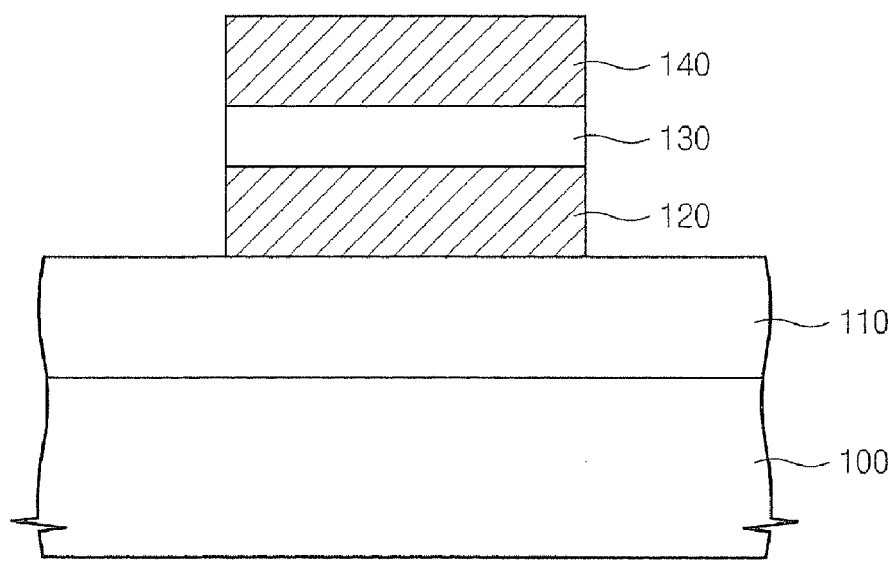
FIG. 2 is a cross-sectional view illustrating another state of a resistive memory element included in a semiconductor device according to some embodiments of the present invention.

Reference is made to FIG. 1, which is a cross-sectional view illustrating one state of a resistive memory element included in a semiconductor device according to some embodiments of the present invention, and FIG. 2, which is a cross-sectional view illustrating another state of a resistive memory element included in a semiconductor device according to some embodiments of the present invention.

A resistive memory element 130 is disposed on a substrate 100. Some embodiments provide that a first electrode 120 is connected to a first surface of the resistive memory element 130 and a second electrode 140 is connected to a second surface of the resistive memory element 130. The first electrode 120, the resistive memory element 130, and the second electrode 140 may be sequentially stacked on the substrate 100. In some embodiments, the second electrode 140, the resistive memory element 130, and the first electrode 120 may be sequentially stacked on the substrate 100. Although the first electrode 120, the resistive memory element 130, and the second electrode 140 may include a flat plate shape as illustrated in FIGS. 1 and 2, the present invention is not limited thereto. Accordingly, the first electrode 120, the resistive memory element 130, and the second electrode 140 may include various different shapes including a stacked structure and/or cylindrical structure, among others.

The first electrode 120, the resistive memory element 130, and the second electrode 140 may be disposed on an insulation layer 110 that may be disposed on the substrate 100. One of the first and second electrodes 120 and 140 may be electrically connected to a switching device. The other of the first and second electrodes 120 and 140 may be electrically connected to an interconnection (e.g., bitline). In some embodiments, the resistive memory element 130 may be used as a data storage element storing logic data. That is, a semiconductor device including the resistive memory element 130 may include a semiconductor memory device, particularly, a nonvolatile memory device. Some embodiments provide that the switching device may include a MOS transistor and/or a unidirectional device (e.g., PN diode, schottkey diode or PIN diode). In some embodiments, the switching device may be disposed under the insulation layer 110. Some embodiments provide that the interconnection may be disposed on an upper insulation layer (not shown) covering the first electrode 120 and the resistive memory element 130, and the second electrode 140.

Some embodiments provide that the first electrode 120 and the second electrode 140 may be connected to a first interconnection and a second interconnection, respectively. In some embodiments, the resistive memory element 130 may be used as a changeable resistor. That is, the resistive memory element 130 may be applied to semiconductor devices requiring the changeable resistor.

Since at least one platinum bridge 150 may be generated and dissipated in the resistive memory element 130, the resistive memory element 130 has resistance states at a multiple levels. That is, resistive memory element may include multiple resistance states including different respective resistance levels from each other. Some embodiments provide that when the platinum bridge 150 is generated, the resistive memory element 130 may have a lower resistance. When the platinum bridge 150 is dissipated, the resistive memory element 130 may have a higher resistance. A first end of the generated platinum bridge 150 may be in contact with the first electrode 120 and a second end of the platinum bridge 150 may be in contact with the second electrode 140. In this regard, an amount of current flowing between the first and second electrodes 120 and 140 in a state where the platinum bridge 150 is generated may be greater than that in a state where the platinum bridge 150 is dissipated. As a result, the resistive memory element 130 may have the resistance states of multiple levels according to generation and dissipation of the platinum bridge 150. FIG. 1 illustrates a semiconductor device in a state where the platinum bridge 150 is generated and FIG. 2 illustrates a semiconductor device in a state where the platinum bridge 150 is dissipated.

In some embodiments, the resistive memory element 130 has a thickness ranging from about 30 Å through about 500 Å. Some embodiments provide that the resistive memory element 130 includes an insulating material. For example, the resistive memory element 130 may include at least one of niobium oxide, titanium oxide, nickel oxide, zirconium oxide, vanadium oxide, PCMO ((Pr, Ca)MnO$_3$), strontium-titanium oxide, barium-strontium-titanium oxide, strontium-zirconium oxide, barium-zirconium-oxide, and/or barium-strontium-zirconium, among others. In this regard, the resistive memory element 130 may include different insulating materials.

According to some embodiments, the first electrode 120 includes platinum, and the platinum bridge 150 may be generated by platinum particles injected into the resistive memory element 130. Methods by which the platinum particles may be injected from the first electrode 120 into the resistive memory element 130 will be described in detail with reference to a flowchart of FIG. 3, which is a flowchart illustrating an operation method of a semiconductor device according to some embodiments of the present invention.

Figure 3:
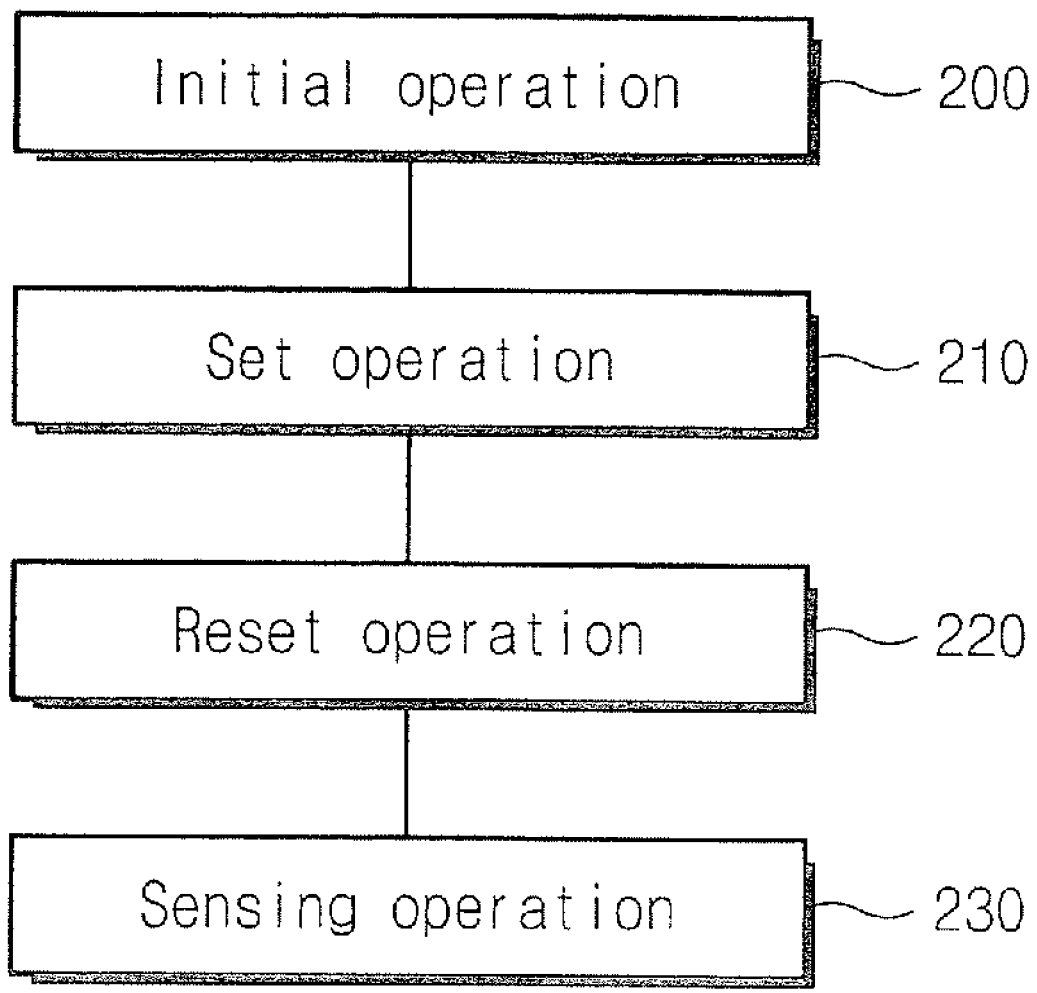
FIG. 3 is a flowchart illustrating an operation method of a semiconductor device according to some embodiments of the present invention.

Referring to FIGS. 1 through 3, a first initial voltage is applied to the first electrode 120 and a second initial voltage is applied to the second electrode 140 to perform an initial operation 200. Accordingly, the platinum particles may be injected from the first electrode 120 into the resistive memory element 130. In some embodiments, the first initial voltage may be greater than the second initial voltage. Thus, during the initial operation 200, an initial electric field directed from the first electrode 120 toward the second electrode 140 may be generated by the first and second initial voltages. The platinum particles are injected from the first electrode 120 into the resistive memory element 130 via the initial electric field. After the initial operation 200, the resistive memory element 130 may have an initial resistance. Some embodiments provide that the density of a portion of the resistive memory element 130 may be reduced by the initial resistance. In some embodiments, the resistive memory element 130 is divided into a first portion in which the density of the insulating material of the resistive memory element 130 is low and a second portion in which the density of the insulating material is greater than that of the first portion. That is, the first portion of the resistive memory element 130 may be porous compared to the second portion.

A set operation 210 that may generate the platinum bridge 150 is now described. Some embodiments provide that a first set voltage is applied to the first electrode 120 and a second set voltage is applied to the second electrode 140 to perform the set operation 210. At least one platinum bridge 150 consisting of platinum atoms injected into the resistive memory element 130 may be generated by the set operation 210. The resistive memory element 130 may have a set resistance due to the set operation 210. The set resistance may be less than the initial resistance.

Some embodiments provide that an electric potential difference between the first and second set voltages is less than the difference between the first and second initial voltages for injecting the platinum atoms. In some embodiments, the electric potential difference between the first and second set voltages ranges from about 0.5V to about 1.5V. Some embodiments provide that the electric potential difference between the first and second initial voltages for injecting the platinum atoms ranges from about 2V to about 6V. A direction of a set electric field generated by the first and second set voltages may be opposite to that of the initial electric field for injecting the platinum atoms. That is, the second set voltage may be greater than the first set voltage.

A reset operation 220 for dissipating the platinum bridge 150 is now described. In some embodiments, a first reset voltage is applied to the first electrode 120 and a second reset voltage is applied to the second electrode 140 to perform the reset operation 220. The platinum bridge 150 may be dissipated by the reset operation 220. Some embodiments provide that the platinum particles constituting the platinum bridge 150 remain in the resistive memory element 130. That is, the platinum bridge 150 may be cut by the reset operation 220. In some embodiments, an electric potential difference between the first and second reset voltages is less than the difference between the first and second initial voltages for injecting the platinum atoms. Some embodiments provide that the electric potential difference between the first and second reset voltages ranges from about 0.5V to about 1.5V. The electric potential difference between the first and second reset voltages may be equal to or different from the electric potential difference between the first and second set voltages. In some embodiments, a reset electric field generated by the first and second reset voltages is opposite to the set electric field. As a result, the set resistance 210 and the reset operation 220 may be selectively performed in the resistive memory element 130. The resistive memory element 130 may have a reset resistance due to the reset operation 220. The reset resistance may be greater than the set resistance and/or the initial resistance. A direction of the reset electric field generated by the first and second reset voltages may be equal to that of the initial electric field.

A sensing operation 230 for reading a resistance state of the resistive memory element 130 is now described. In some embodiments, a first sensing voltage and a second sensing voltage are applied to the first electrode 120 and the second electrode 140, respectively, to read a resistance of the resistive memory element 130. An electric potential difference between the first and second sensing voltages may be less than those between the first and second set voltages and between the first and second reset voltages. Thus, during the sensing operation 230, the resistance of the resistive memory element 130 can be read without changing the resistance state of the resistive memory element 130. During the sensing operation 230, a direction of a flowing current may be equal to that of the set electric field and/or different from a direction of the reset electric field.

When the first electrode 120 includes platinum, the second electrode 140 may be formed of conductive materials including superior thermal stability. For example, some embodiments provide that the second electrode 140 may include at least one of a conductive metal nitride (e.g., TiN, TaN, WN, and/or TiAlN) and platinum, among others. In some embodiments, the second electrode 120 may include the conductive materials having superior thermal stability except the materials described above.

According to some embodiments of the present invention, the resistive memory element 130 may include insulating materials doped with the platinum atoms and/or the platinum bridge 150 may include the platinum atoms doped into the resistive memory element 130. For example, the resistive memory element 130 may include the insulating materials doped with the platinum atoms. Some embodiments provide that the resistive memory element 130 may include at least one of Pt doped niobium oxide, Pt doped titanium oxide, Pt doped nickel oxide, Pt doped zirconium oxide, Pt doped vanadium oxide, Pt doped PCMO (Pt doped (Pr, Ca)MnO3), Pt doped strontium-titanium oxide, Pt doped barium-stron-tium-titanium oxide, Pt doped strontium-zirconium oxide, Pt doped barium-zirconium-oxide, and/or Pt doped barium-strontium-zirconium, among others. In embodiments where the resistive memory element 130 includes Pt doped insulating materials, the first and second electrodes 120 and 140 may include the conductive materials other than platinum (e.g., the conductive metal nitride) may have superior thermal stability.

If the resistive memory element 130 includes the Pt doped insulating materials and the first and second electrodes 120 and 140 are formed of the conductive materials except platinum, the electric potential difference between the first and second initial voltages of the initial operation may be equal to or greater than the electric potential difference between the first and second set voltages. In this case, the direction of the initial electric field may be irrelevant to the direction of the set electric field. Accordingly, the direction of the initial electric field may be equal or opposite to that of the set electric field. Some embodiments provide that the initial operation 200 may be omitted. The reset operation 210, the set operation 220, and/or the sensing operation 230 may include the same conditions as those described above.

According to some embodiments of the present invention, the resistive memory element 130 may include the Pt doped insulating materials and the first electrode 120 may include platinum. In such embodiments, the platinum bridge 150 may include the platinum atoms within the resistive memory element 130 and the platinum particles injected from the first electrode 120. In this case, the direction of the initial electric field may be opposite to that of the set electric field. The electric potential difference between the first and second initial voltages may be equal to or greater than that the electric potential difference between the first and second set voltages. The reset operation 210, the set operation 220, and the sensing operation 230 may include similar conditions as those described above.

According to the semiconductor device described above, the resistive memory element 130 may include resistance states at a plurality of levels according to generation and dissipation of at least one platinum bridge 150. The platinum bridge 150 may have the superior thermal stability. Thus, the characteristics of the resistive memory element 130 can be minimized and deterioration due to an external environment may be reduced and/or prevented. Also, endurance of the resistive memory element 130 may be improved. That is, although a number of cycles of the set operation 210 and the reset operation 220 may increase in the resistive memory element 130, the resistive memory element 130 may retain the resistance states corresponding to the plurality of levels. Further, since the platinum bridge 150 may have the superior thermal stability, the electric potential difference (i.e., amplitude of set threshold voltage) between the first and second set voltages and the electric potential difference (i.e., amplitude of reset threshold voltage) between the first and second reset voltages may be sufficiently secured. In this manner, a margin for sensing the resistance of the resistive memory element 130 may increase. In this regard, the semiconductor device including the resistive memory element 130 may realize excellent reliability. Furthermore, platinum is a material that may include physical and/or chemical stability and thus may not act as a pollution source. Accordingly, management of a semiconductor process for treating platinum may improve in productivity regarding the semiconductor device.

Thermally unstable conductive materials (e.g., silver or copper) can deteriorate reliability of the semiconductor device. That is, the thermally unstable conductive materials may be sensitive to the external environment, have a higher diffusion coefficient, and/or may act as a pollution source.

Thus, reliability of a semiconductor device using thermally unstable conductive materials may be deteriorated. Further, if a bridge is formed of thermally unstable conductive materials, the amplitude of the set threshold voltage and/or the amplitude of the reset threshold voltage for generation and dissipation of the bridge may be significantly lower. As a result, a sensing margin of a resistor having the bridge formed of thermally unstable conductive materials may be greatly reduced. In this regard, since the resistive memory element 130 according to some embodiments of the present invention uses the platinum bridge 150 having the superior thermal stability, a semiconductor device having excellent reliability can be implemented.

Hereinafter, the characteristics corresponding to a semiconductor device according to some embodiments of the present invention will be described in detail with reference to experiment data.

A first sample (Sample 1) was prepared for a first experiment for identifying characteristics of a resistive memory element 130 according to some embodiments of the present invention. Regarding Sample 1, a platinum layer having a thickness of about 1000 Å corresponding to a first electrode 120 was formed on a substrate, a PCMO layer having a thickness of about 200 Å corresponding to the resistive memory element 130 was formed on the platinum layer, and a titanium nitride layer having a thickness of about 1000 Å corresponding to a second electrode 140 was formed on the PCMO layer.

The initial operation 200 of FIG. 3 was performed with Sample 1. Specifically, 0V provided as a first initial voltage was applied to the platinum layer, and −4V provided as a second initial voltage was applied to the titanium nitride layer. Before the initial operation 200 was performed, a resistance value of the PCMO layer was measured at about $10^{10}\Omega$. After the initial operation 200 had been performed, the resistance of the PCMO layer was reduced to about $10^{5}\Omega$.

The set operation 210 of FIG. 3 was performed with Sample 1 on which the initial operation 200 had been performed. In detail, 0V provided as a first set voltage was applied to the platinum layer and 1V provided as a second set voltage was applied to the titanium nitride layer. After the set operation 210 had been performed, the resistance of the PCMO layer was further reduced to about $10^{4}\Omega$. After the set operation 210 had been performed, the resistance of the PCMO layer was measured using a sensing voltage of about 0.2V. That is, for sensing the resistance of the PCMO layer, 0V provided as a first sensing voltage was applied to the platinum layer, and 0.2V provided as a second sensing voltage was applied to the titanium nitride layer.

The reset operation 220 of FIG. 3 was performed with Sample 1. Specifically, 0V provided as a first reset voltage was applied to the platinum layer and −4V provided as a second reset voltage was applied to the titanium nitride layer. After the reset operation 220 had been performed, the resistance of the PCMO layer was measured at about $5\times10^{5}\Omega$. That is, the resistance of the PCMO layer after the reset operation 220 had been performed increased by a factor of 50 relative to that of the PCMO layer after the set operation 210 had been performed.

Figure 4:
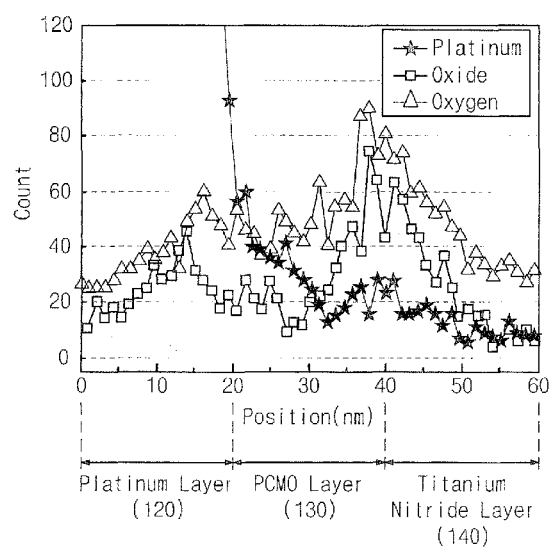
FIG. 4 is a graph illustrating data measured using energy dispersive spectrometer in order to explain characteristics of a semiconductor device according to some embodiments of the present invention.
Figure 4:
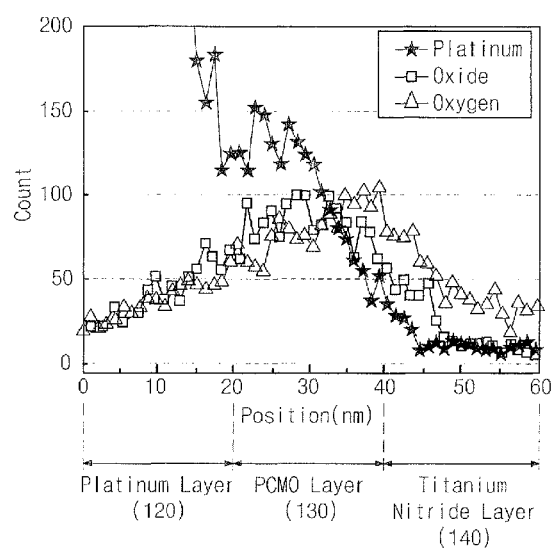

After the set operation 210 had been performed, material components of the PCMO layer of Sample 1 were measured using an energy dispersive spectrometer (EDS). FIG. 4 is a graph illustrating data measured by the EDS to illustrate and/or explain the characteristics of the semiconductor device according to some embodiments of the present invention.

Referring to FIG. 4, when Sample 1 was observed using a high resolution transmission electron microscopy (HRTEM), it was confirmed that a platinum bridge existed within the PCMO layer. Reference numeral "a" corresponds to data obtained by measuring a portion of Sample 1 where the platinum bridge is not formed (e.g., arrow A1 of FIG. 1) using the EDS. Reference numeral "b" corresponds to data obtained by measuring a portion of Sample 1 where the platinum bridge is formed (e.g., arrow A2 of FIG. 1) using the EDS. In the drawings, an x-axis denotes a position and a y-axis denotes a count of the EDS corresponding to each of materials.

As shown in FIG. 4, a measured count of platinum is less than about 60 counts at the portion "a" of Sample 1. In contrast, a measured count of platinum is more than about 100 count at the portion "b" of Sample 1. As a result, it may be confirmed that the platinum bridge is formed within the PCMO layer.

A second experiment for explaining thermal stability of the semiconductor device according to some embodiments of the present invention was performed. A second sample (Sample 2) was prepared for the second experiment. Sample 2 includes the same structure as Sample 1. That is, Sample 2 includes a platinum layer, a PCMO layer, and a titanium nitride layer, which are sequentially stacked. The second experiment is described below in detail with reference to FIG. 5, which is a graph illustrating experiment data for explaining thermal stability of a semiconductor device according to some embodiments of the present invention. In the graph, an x-axis denotes a baking time and a y-axis denotes a resistance value of the PCMO layer of Sample 2.

Figure 5:
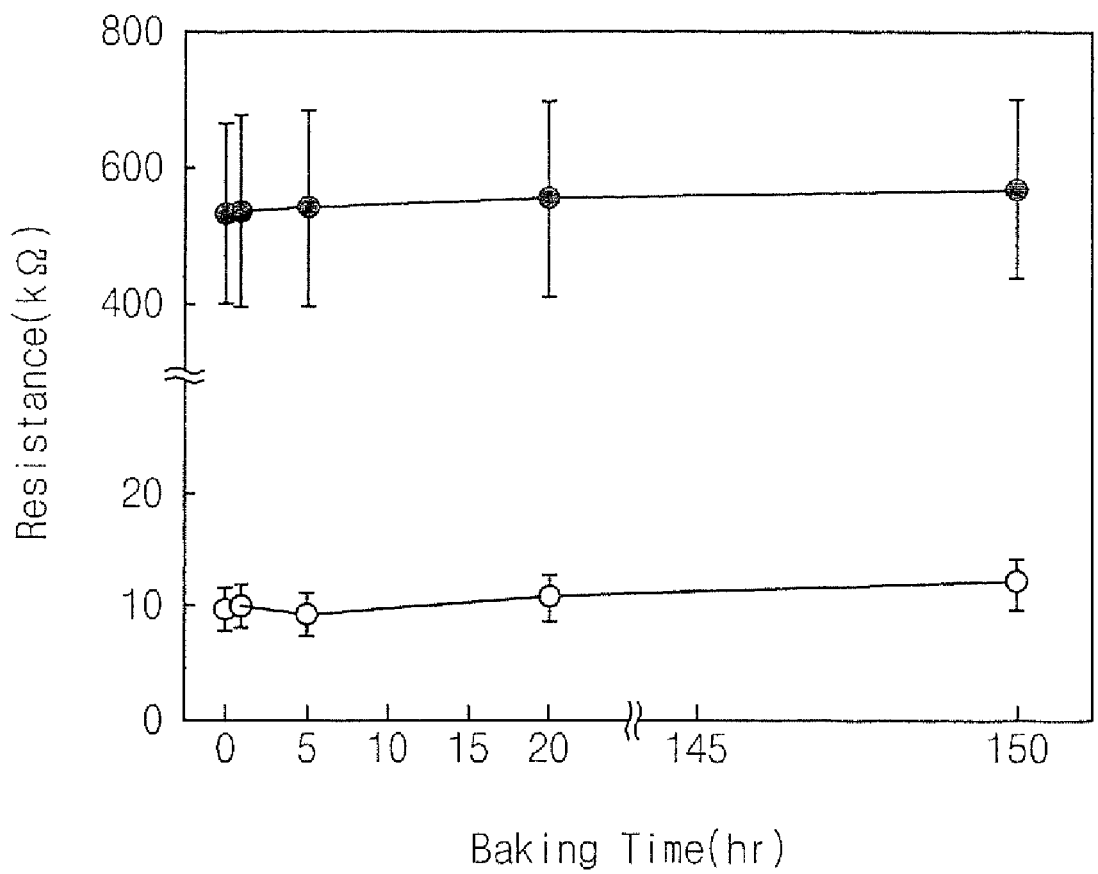
FIG. 5 is a graph illustrating experiment data for explaining thermal stability of a semiconductor device according to some embodiments of the present invention.

Referring to FIG. 5, Sample 2 was baked at a temperature of about 150° C. using, an oven. The set operation 210, the reset operation 220, and the sensing operation 230 were performed with Sample 2 according to the baking time to measure the resistance value of the PCMO layer of Sample 2. As shown in FIG. 5, a set resistance and a reset resistance of Sample 2 was stable even if Sample 2 was baked at a temperature of about 150° C. for a time period of about 150 hours. As a result, it may be realized that the resistive memory element 130 having the platinum bridge 150 according to some embodiments of the present invention may have superior thermal stability.

A third experiment for explaining endurance of the semiconductor device according to some embodiments of the present invention was performed. A third sample (Sample 3) was prepared for the third experiment. Sample 3 includes a platinum layer (1000 Å), a PCMO layer (100 Å), and a titanium nitride layer (1000 Å), which are sequentially stacked. The third experiment will be described in detail with reference to FIG. 6, which is a graph illustrating experiment data for explaining endurance of a semiconductor device according to some embodiments of the present invention. An x-axis denotes a number of cycles including the set operation and the reset operation and a y-axis denotes an amount of current flowing through the PCMO layer.

Figure 6:
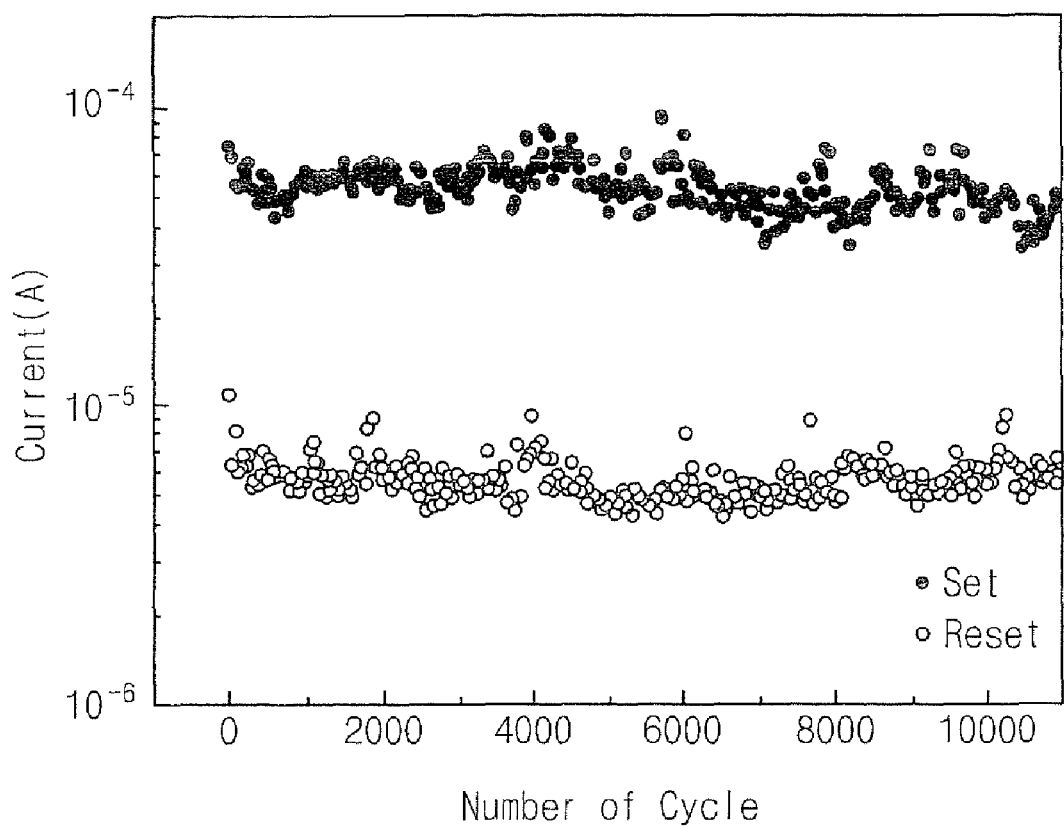
FIG. 6 is a graph illustrating experiment data for explaining endurance of a semiconductor device according to some embodiments of the present invention.

Referring to FIG. 6, 0V provided as a first initial voltage was applied to the platinum layer of Sample 3 and −4V provided as a second initial voltage was applied to the titanium nitride layer to perform the initial operation of FIG. 3. The set operation and the reset operation were repeated with Sample 3 after the initial operation had been performed. Specifically, in the set operation, 0V (first set voltage) and 2V (second set voltage) were applied to the platinum layer and the titanium nitride layer of Sample 3 for a time period of about 20 ms, respectively. In the reset operation, 0V (first reset voltage) and −3V (second reset voltage) were applied to the platinum layer and the titanium nitride layer of Sample 3 for a time period of about 20 ms, respectively. 0V (first sensing voltage) and −0.1V (second sensing voltage) were applied to the platinum layer and the titanium nitride layer of Sample 3, respectively, to measure the amount of current flowing through the PCMO layer of Sample 3. To determine endurance, a cycle including the set operation and the reset operation was repeated 10000 times or more.

As shown in FIG. 6, it is recognized that a difference between an amount of current in a set state and an amount of current in a reset state of the PCMO layer of Sample 3 is retained even if the cycle is repeated 10000 times or more. Thus, it may be realized that the resistive memory element 130 according to some embodiments of the present invention may have superior endurance.

The semiconductor device including the resistive memory element 130 according to some embodiments of the present invention may be used as a semiconductor device for storing data.

A semiconductor device including the resistive memory element 130 according to some embodiments of the present invention may be used in all semiconductor devices that may include a variable resistor. For example, a semiconductor device according to some embodiments of the present invention may be used as a logic device (e.g., a microprocessor, a digital signal processor, a micro controller, and/or a logic device capable of performing functions similar to that of those) including a variable resistor. Also, a semiconductor device according to some embodiments of the present invention may be used as a hybrid device that includes a variable resistor, a memory device, and/or a logic device, among others.

An electronic system according to some embodiments of the present invention is disclosed. For example, an electronic system according to some embodiments of the present invention may include a semiconductor device as described above with reference to FIGS. 1 through 6.

Figure 7:
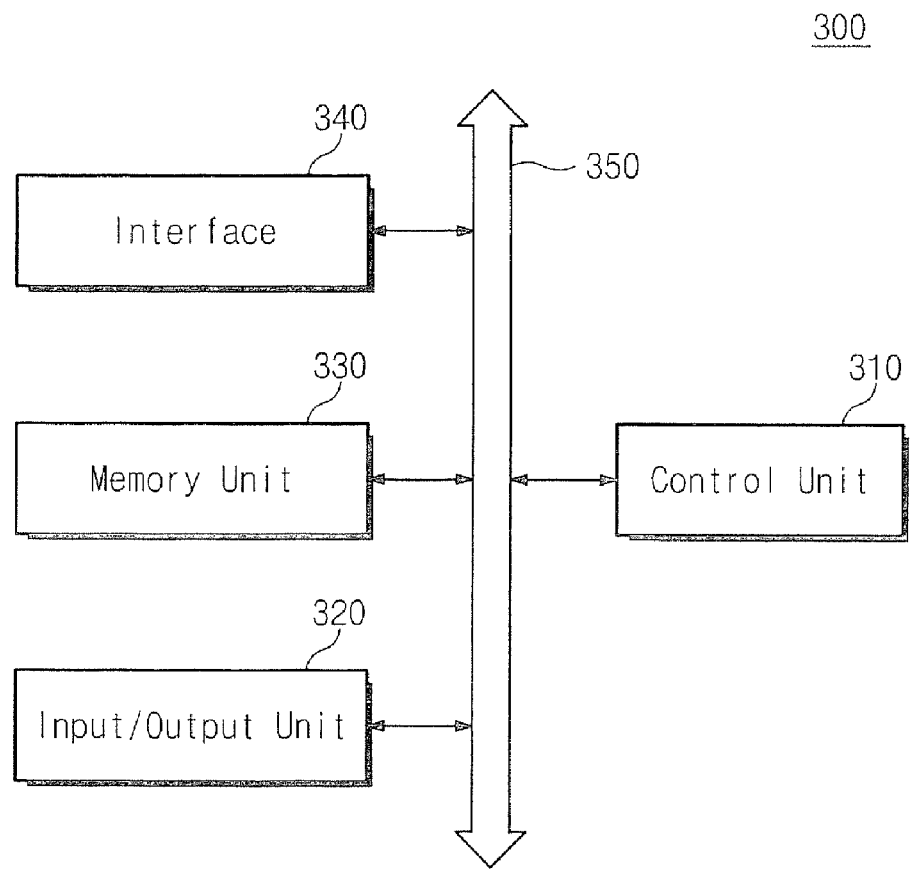
FIG. 7 is a block diagram of an electronic system according to some embodiments of the present invention.

Reference is now made to FIG. 7, which is a block diagram of an electronic system according to some embodiments of the present invention. An electronic system 300 may include a control unit 310, an input/output unit 320, and/or a memory unit 330. The control unit 310, the input/output unit 320, and the memory unit 330 may be connected to each other through a bus 350. The bus 350 may be a path through which data is moved. The control unit 310 may include at least one of the logic devices described with reference to FIGS. 1 through 6. For example, the control unit 310 may include at least one of a microprocessor including the resistive memory element 130 of FIGS. 1 and 2, a digital signal processor, a micro controller, and/or a logic device capable of performing functions similar to that of those, among others.

The input/output unit 320 may include a keypad, keyboard, and/or a display device, among others. The memory unit 330 may be configured to store data. The memory unit 330 can store data and/or commands executed by the control unit 310. In some embodiments, the memory unit 330 includes a semiconductor memory device having a cell including the resistive memory element 130 of FIGS. 1 and 2. The electronic system 300 may further include an interface 340 for transmitting/receiving data to/from, for example, a communication network. The interface 340 may have a wired and/or wireless connection. For example, the interface 340 may include an antenna and/or a wired/wireless transceiver.

The electronic system 300 may be used as a mobile system, a personal computer, an industrial computer, and/or a system capable of performing various functions, among others. For example, the mobile system may include a personal digital assistant, a portable computer, a web tablet, a mobile phone, a wireless phone, a laptop computer, a memory card, a digital music system, and/or an information transmission/reception system, among others. If the electronic system 300 can perform a wireless communication, the electronic system 300 may be used for a communication interface protocol such as a third generation communication system such as CDMA, GSM, NADC, E-TDMA, WCDMA, and/or CDMA2000, among others.

Figure 8:
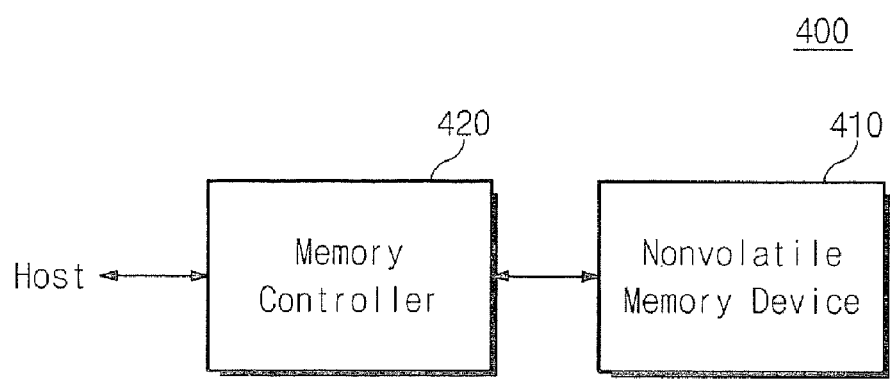
FIG. 8 is a block diagram of a memory card according to some embodiments of the present invention.

A memory card according to an embodiment of the present invention will now be described with reference to FIG. 8, which is a block diagram of a memory card according to some embodiments of the present invention. A memory card 400 includes a nonvolatile memory device 410 and a memory controller 420. In some embodiments, the nonvolatile memory device 410 includes a semiconductor memory device having unit cells including the resistive memory element 130 described with reference to FIGS. 1 and 2. The memory controller 420 may control the flash memory device 410 to read data stored in response to read/write requirement of a host and/or stored data.

According to some embodiments of the present invention, the resistive memory element may have the resistance states of multiple levels according to the generation and dissipation of the platinum bridge. The platinum bridge may have superior thermal stability. In this regard, the semiconductor device including the resistive memory element may realize excellent reliability. Also, an electric potential difference between the first surface and the second surface of the resistive memory element may be sufficiently large for the generation and/or the dissipation of the platinum bridge. Accordingly, a margin for sensing the resistance of the resistive memory element may increase. In addition, due to the platinum bridge, the endurance of the resistive memory element may be improved. Furthermore, since the platinum may be a stable material, the management thereof may be more easily facilitated. In this regard, manufacturing costs of the semiconductor device may be reduced.

Although the present invention has been described in terms of specific embodiments, the present invention is not intended to be limited by the embodiments described herein. Thus, the scope may be determined by the following claims.

What is claimed is:

1. A semiconductor device, comprising:
   a substrate; and
   a resistive memory element disposed on the substrate, the resistive memory element including a plurality of resistance state levels that correspond to generation and dissipation of at least one platinum bridge therein.

2. The semiconductor device of claim 1, further comprising:
   a first electrode that is on the substrate and connected to a first surface of the resistive memory element; and
   a second electrode that is on the substrate and connected to a second surface of the resistive memory element.

3. The semiconductor device of claim 2, wherein the first electrode and the second electrode are in contact with a first end and a second end of the platinum bridge, respectively.

4. The semiconductor device of claim 2, wherein the first electrode comprises platinum.

5. The semiconductor device of claim 4, wherein the platinum bridge comprises platinum particles that are injected from the first electrode into the resistive memory element.

6. The semiconductor device of claim 5, wherein the platinum particles comprise platinum particles that are injected from the first electrode into the resistive memory element responsive to application of a first initial voltage and a second initial voltage to the first electrode and the second electrode, respectively.

7. The semiconductor device of claim 6, wherein the first initial voltage is greater than the second initial voltage.

8. The semiconductor device of claim 6, wherein the platinum bridge is generated by respectively applying a first set voltage and a second set voltage to the first electrode and the second electrode, and
wherein an electric potential difference between the first set voltage and the second set voltage is less than an electric potential difference between the first initial voltage and the second initial voltage.

9. The semiconductor device of claim 8, wherein a direction of an initial electric field generated by the first initial voltage and the second initial voltage is opposite to that of a set electric field generated by the first set voltage and the second set voltage.

10. The semiconductor device of claim 6, wherein the platinum bridge is dissipated by respectively applying a first reset voltage and a second reset voltage to the first electrode and the second electrode, and
wherein an electric potential difference between the first reset voltage and the second reset voltage is less than an electric potential difference between the first initial voltage and the second initial voltage.

11. The semiconductor device of claim 10, wherein a direction of an initial electric field generated by the first initial voltage and the second initial voltage is equal to that of a reset electric field generated by the first reset voltage and the second reset voltage.

12. The semiconductor device of claim 2, wherein the resistive memory element comprises an insulating material doped with platinum atoms.

13. The semiconductor device of claim 12, wherein the platinum bridge including platinum atoms doped into the resistive memory element is generated by respectively applying a first set voltage and a second set voltage to the first electrode and the second electrode, and
wherein the platinum bridge is dissipated by respectively applying a first reset voltage and a second reset voltage to the first electrode and the second electrode.

14. The semiconductor device of claim 13, wherein a first initial voltage and a second initial voltage are applied to the first electrode and the second electrode, respectively, and
wherein an electric potential difference between the first initial voltage and the second initial voltage is equal to or greater than an electric potential difference between the first set voltage and the second set voltage.

15. The semiconductor device of claim 12, wherein the first electrode comprises platinum.

16. The semiconductor device of claim 15, wherein the generated platinum bridge comprises:
platinum atoms doped into the resistive memory element; and
platinum within the first electrode.

17. The semiconductor device of claim 2, wherein the platinum bridge is generated by applying a first set voltage and a second set voltage to the first electrode and the second electrode, respectively,
wherein the platinum bridge is dissipated by applying a first reset voltage and a second reset voltage to the first electrode and the second electrode, respectively, and
wherein a direction of a set electric field generated by the first set voltage and the second set voltage is opposite to that of a reset electric field generated by the first reset voltage and the second reset voltage.

18. The semiconductor device of claim 2, wherein the platinum bridge is generated by applying a first set voltage and a second set voltage to the first electrode and the second electrode, respectively, and
wherein an electric potential difference between the first set voltage and the second set voltage ranges from about 0.5V to about 1.5V.

19. The semiconductor device of claim 1, wherein the resistive memory element comprises an insulating material, and
wherein the resistive memory element comprises a first portion including a first density in the insulating material and a second portion having a second density that is different from the first density in the insulating material.

20. A semiconductor device, comprising:
a substrate;
a resistive memory element disposed on the substrate, the resistive memory element including a plurality of resistance state levels that correspond to generation and dissipation of at least one platinum bridge therein;
a first electrode that is on the substrate and connected to a first surface of the resistive memory element; and
a second electrode that is on the substrate and connected to a second surface of the resistive memory element,
wherein the platinum bridge comprises platinum particles that are injected from the first electrode into the resistive memory element responsive to application of a first initial voltage and a second initial voltage to the first electrode and the second electrode, respectively,
wherein the platinum bridge is generated by respectively applying a first set voltage and a second set voltage to the first electrode and the second electrode,
wherein an electric potential difference between the first set voltage and the second set voltage is less than an electric potential difference between the first initial voltage and the second initial voltage, and
wherein a direction of an initial electric field generated by the first initial voltage and the second initial voltage is opposite to that of a set electric field generated by the first set voltage and the second set voltage.

* * * * *